United States Patent
Kobayashi

(10) Patent No.: US 10,340,858 B2
(45) Date of Patent: Jul. 2, 2019

(54) LINEARIZED DISTRIBUTED AMPLIFIER ARCHITECTURE

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/636,800

(22) Filed: Jun. 29, 2017

(65) Prior Publication Data
US 2018/0019712 A1    Jan. 18, 2018

Related U.S. Application Data

(60) Provisional application No. 62/361,195, filed on Jul. 12, 2016, provisional application No. 62/410,608, filed on Oct. 20, 2016.

(51) Int. Cl.
| | |
|---|---|
| *H03F 3/60* | (2006.01) |
| *H03F 1/18* | (2006.01) |
| *H03F 1/22* | (2006.01) |
| *H03F 3/195* | (2006.01) |

(52) U.S. Cl.
CPC .............. *H03F 1/18* (2013.01); *H03F 1/223* (2013.01); *H03F 3/195* (2013.01); *H03F 2200/451* (2013.01)

(58) Field of Classification Search
CPC . H03F 1/18; H03F 3/195; H03F 1/223; H03F 2200/451
USPC ........................................ 330/286, 285, 295
See application file for complete search history.

(56) References Cited

U.S. PATENT DOCUMENTS

| | | |
|---|---|---|
| 2,957,143 A | 10/1960 | Enloe |
| 4,540,954 A | 9/1985 | Apel |
| 5,208,547 A | 5/1993 | Schindler |
| 5,361,038 A | 11/1994 | Allen et al. |
| 5,365,197 A | 11/1994 | Ikalainen |

(Continued)

OTHER PUBLICATIONS

Claveau, Régis et al., "Novel Active Load for 40 Gbps Optical Modulator Drivers," 33rd European Microwave Conference, 2003, Munich, Germany, pp. 1095-1097.

(Continued)

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A distributed amplifier (DA) is disclosed. The DA includes a first plurality of inductive elements coupled in series forming a first plurality of connection nodes. The DA also includes a second plurality of inductive elements coupled in series forming a second plurality of connection nodes. The DA further includes a plurality of amplifier cells that each has a main transistor and a cascode transistor coupled into a cascode configuration. The cascode transistor has a current input coupled to a corresponding one of the first plurality of connection nodes. An input transistor has a control terminal coupled to a corresponding one of the second plurality of connection nodes, a current input terminal configured to provide a bias tuning for the DA, and a third current output terminal coupled to a control terminal of the main transistor and configured to provide a separate bias tuning for the DA.

32 Claims, 11 Drawing Sheets

(56) References Cited

U.S. PATENT DOCUMENTS

| | | | |
|---|---|---|---|
| 5,559,472 | A | 9/1996 | Kobayashi |
| 6,049,250 | A | 4/2000 | Kintis et al. |
| 6,894,566 | B2 | 5/2005 | Claveau et al. |
| 7,525,385 | B2 * | 4/2009 | Kumar .................. H03F 1/223 330/295 |
| 7,804,362 | B2 | 9/2010 | Nguyen |
| 8,035,449 | B1 | 10/2011 | Kobayashi |
| 8,058,930 | B1 | 11/2011 | Kobayashi |
| 8,451,059 | B1 | 5/2013 | Kobayashi |
| 8,665,022 | B2 | 3/2014 | Kobayashi |
| 8,823,455 | B2 | 9/2014 | Kobayashi |
| 2003/0184384 | A1 | 10/2003 | Off et al. |
| 2010/0283546 | A1 | 11/2010 | Visser et al. |
| 2012/0086511 | A1 | 4/2012 | Nilsson et al. |
| 2014/0111279 | A1 | 4/2014 | Brobston |
| 2017/0099038 | A1 | 4/2017 | Kobayashi |

OTHER PUBLICATIONS

Coers, Malte et al., "DC to 6.5 GHz Highly Linear Low-Noise AlGaN/GaN Traveling Wave Amplifier with Diode Predistortion," 2014 IEEE MTT-S International Microwave Symposium, Jun. 1-6, 2014, IEEE, 4 pages.

Ikalainen, Pertti K., "Low-Noise Distributed Amplifier with Active Load," IEEE Microwave and Guided Wave Letters, vol. 6, No. 1, Jan. 1996, pp. 7-9.

Kawashima, Munenari et al., "A Low-Noise Distributed Amplifier Using Cascode-Connected BJTs Terminal Circuit," Proceedings of AMPC2001, 2001, IEEE, pp. 21-24.

Kimura, Shunji et al., "0-40 GHz GaAs MESFET Distributed Baseband Amplifier IC's for High-Speed Optical Transmission," IEEE Transactions on Microwave Theory and Techniques, vol. 44, No. 11, Nov. 1996, pp. 2076-2082.

Kobayashi, Kevin W. et al., "A Novel 100 MHz-45 GHz Input-Termination-Less Distributed Amplifier Design With Low-Frequency Low-Noise and High Linearity Implemented With a 6 Inch 0.15 µm GaN—SiC Wafer Process Technology," IEEE Journal of Solid-State Circuits, vol. 51, No. 9, Sep. 2016, pp. 2017-2026.

Kobayashi, Kevin W. et al., "A novel HBT Distributed Amplifier Design Topology based on Attenuation compensation Techniques," IEEE Transactions on Microwave Theory and Techniques, vol. 42, No. 12, 1994, pp. 2583-2589.

Kobayashi, Kevin W. et al., "Extending the Bandwidth Performance of Heterojunction Bipolar Transistor-based Distributed Amplifiers," IEEE Transactions on Microwave Theory and Techniques, vol. 44, No. 5, May 1996, pp. 739-748.

Kobayashi, Kevin W. et al., "Multi-Decade GaN HEMT Cascode-Distributed Power Amplifier with baseband Performance," 2009 IEEE Radio Frequency Integrated Circuits Symposium, 2009, IEEE, pp. 369-372.

Moon, Jeong-Sun et al., "Wideband Linear Distributed GaN HEMT MMIC Power Amplifier with a Record OIP3/Pdc," 2016 IEEE Topical Conference on PAWR Applications, Jan. 24-27, 2016, IEEE, pp. 5-7.

Pornpromlikit, Sataporn et al., "A Watt-Level Stacked-FET Linear Power Amplifier in Silicon-on-Insulator CMOS," IEEE Transactions on Microwave Theory and Techniques, vol. 58, No. 1, Jan. 2010, pp. 57-64.

Robertson, I. D. et al., "Ultrawideband Biasing of MMIC Distributed Amplifiers Using Improved Active Load," Electronics Letters, vol. 27, No. 21, Oct. 10, 1991, pp. 1907-1908.

Yamaguchi, Yo et al., "A Wideband GaN Low Noise Amplifier for a Frequency Sensing System," Proceedings of Asia-Pacific Microwave Conference 2014, TH1B-3, Nov. 4-7, 2014, IEICE, pp. 420-422.

Non-Final Office Action for U.S. Appl. No. 15/225,131, dated Mar. 31, 2017, 6 pages.

Notice of Allowance for U.S. Appl. No. 15/225,131, dated Jul. 25, 2017, 7 pages.

\* cited by examiner

LINEARIZED DISTRIBUTED AMPLIFIER ARCHITECTURE

RELATED APPLICATIONS

This application claims the benefit of provisional patent application Ser. No. 62/361,195, filed Jul. 12, 2016, and provisional patent application Ser. No. 62/410,608, filed Oct. 20, 2016, the disclosures of which are hereby incorporated herein by reference in their entirety.

This application is related to U.S. patent application Ser. No. 15/225,131, filed Aug. 1, 2016, now U.S. Pat. No. 9,825,603, titled "ACTIVE DRAIN TERMINATED DISTRIBUTED AMPLIFIER," which claims the benefit of provisional patent application Ser. No. 62/237,014, filed Oct. 5, 2015.

This application is related to U.S. patent application Ser. No. 13/457,536, filed Apr. 27, 2012, now U.S. Pat. No. 8,665,022, titled "LOW NOISE-LINEAR POWER DISTRIBUTED AMPLIFIER," which claims the benefit of U.S. provisional patent application Ser. No. 61/480,106, filed Apr. 28, 2011.

This application is related to U.S. patent application Ser. No. 13/154,910, filed Jun. 7, 2011, now U.S. Pat. No. 8,451,059, titled "CAPACITIVELY-COUPLED DISTRIBUTED AMPLIFIER WITH BASEBAND PERFORMANCE," which is a continuation of U.S. patent application Ser. No. 12/651,717, filed Jan. 4, 2010, now U.S. Pat. No. 8,035,449, titled "CAPACITIVELY-COUPLED DISTRIBUTED AMPLIFIER WITH BASEBAND PERFORMANCE," both of which claim the benefit of provisional patent application Ser. No. 61/142,283, filed Jan. 2, 2009.

This application is related to U.S. patent application Ser. No. 12/651,726, filed Jan. 4, 2010, now U.S. Pat. No. 8,058,930, titled "CAPACITIVELY-COUPLED NON-UNIFORMLY DISTRIBUTED AMPLIFIER," which claims the benefit of provisional patent application Ser. No. 61/142,283, filed Jan. 2, 2009.

All of the applications listed above are hereby incorporated by reference in their entireties.

FIELD OF THE DISCLOSURE

The present disclosure relates to distributed amplifiers and in particular to gallium nitride (GaN) distributed amplifiers having transconductance device cells.

BACKGROUND

Broadband gallium nitride (GaN) distributed amplifiers (DAs) covering multi-decades of bandwidth and providing high third-order intercept point linearity can enable advanced radio communication such as software-defined radios, linear fiber optic, instrumentation, and frequency-agile wireless applications. A high-linearity DA operating to millimeter-wave frequencies can be particularly enabling for 100+ gigabits per second (Gbps) coherent-linear fiber optics and instrumentation applications. However, up until now, efforts to increase linearity have been made at the expense of gain-bandwidth, which has limited high-linearity DAs to a microwave frequency range that is less than 20 GHz. Thus, a need remains for DAs that have increased linearity and gain-bandwidth.

SUMMARY

A distributed amplifier (DA) is disclosed. The DA includes a first plurality of inductive elements coupled in series forming a first plurality of connection nodes. The DA also includes a second plurality of inductive elements coupled in series forming a second plurality of connection nodes. The DA further includes a plurality of amplifier cells that each has a main transistor and a cascode transistor coupled into a cascode configuration. The cascode transistor has a current input coupled to a corresponding one of the first plurality of connection nodes. An input transistor has a control terminal coupled to a corresponding one of the second plurality of connection nodes, a current input terminal configured to provide a bias tuning for the DA, and a third current output terminal coupled to a control terminal of the main transistor and configured to provide a separate bias tuning for the DA.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
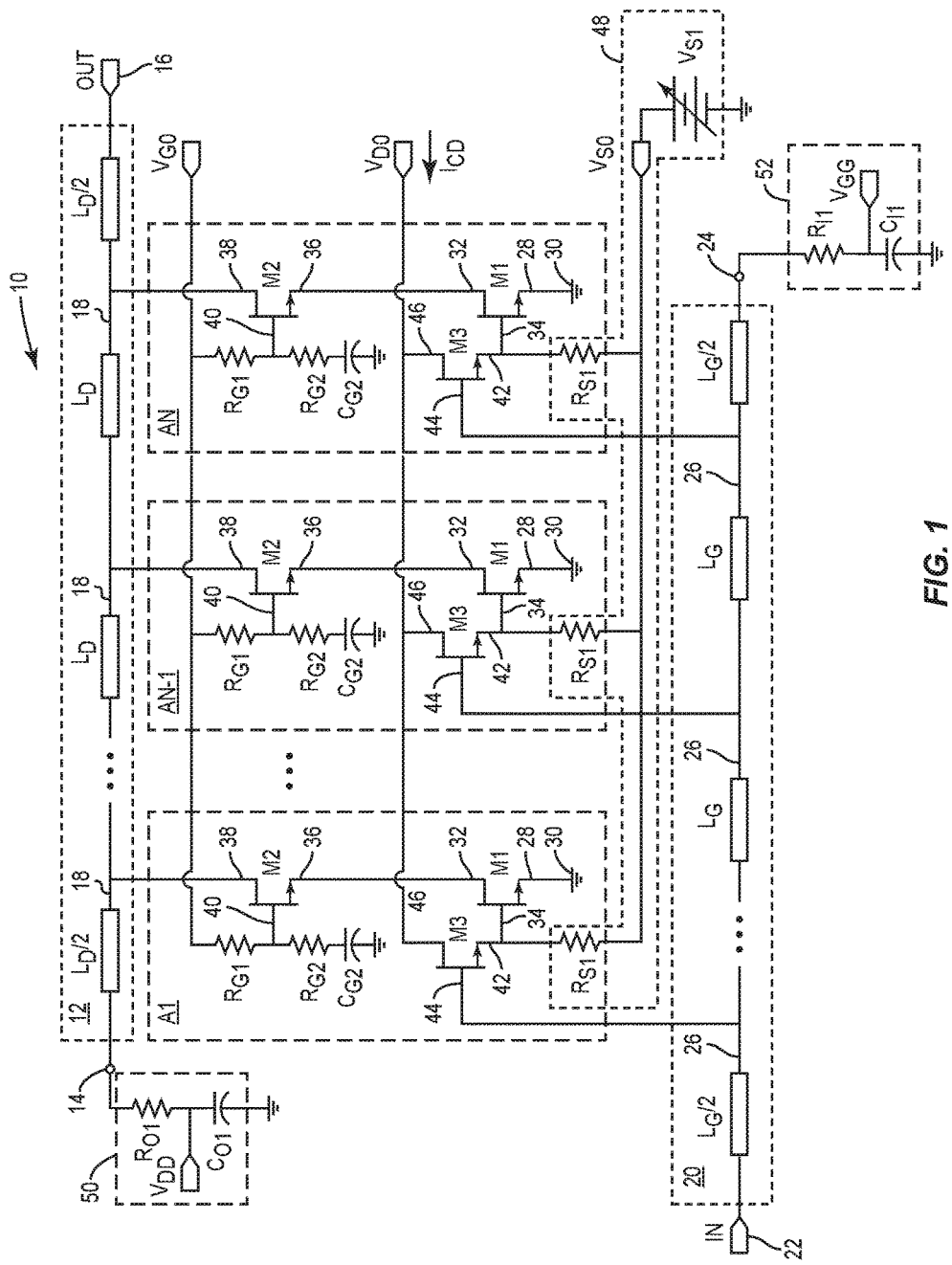
FIG. 1 is a circuit schematic of a one embodiment of the distributed amplifier (DA) of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a circuit schematic of one embodiment of the distributed amplifier (DA) 10 of the present disclosure. The DA 10 includes a first plurality of inductive elements 12 coupled in series between an output termination input 14 and a DA output 16 to form a first plurality of connection nodes 18, such that each of the first plurality of connection nodes 18 is coupled to a corresponding adjacent pair of the first plurality of inductive elements 12. A second plurality of inductive elements 20 is coupled in series between a DA input 22 and an input termination input 24 to form a second plurality of connection nodes 26, such that each of the second plurality of connection nodes 26 is coupled to a corresponding adjacent pair of the second plurality of inductive elements 20.

The DA 10 also includes a plurality of amplifiers $A_1$ through $A_N$, where N is a finite positive whole number greater than 2. Each of the plurality of amplifiers $A_1$ through $A_N$ includes a main transistor $M_1$ having a first current output terminal 28 coupled to a fixed voltage node 30, a first current input terminal 32, and a first control terminal 34. In the exemplary embodiment of FIG. 1, the fixed voltage node 30 is ground. A cascode transistor $M_2$ has a second current output terminal 36 coupled to the first current input terminal 32, a second current input terminal 38 coupled to a corresponding one of the first plurality of connection nodes 18, and a second control terminal 40 configured to bias the cascode transistor $M_2$. The second control terminal 40 of the cascode transistor $M_2$ is coupled to a bias voltage input $V_{G0}$ through a first gate resistor $R_{G1}$. A second gate resistor $R_{G2}$ coupled in series with a direct current (DC) blocking capacitor $C_{G2}$ is coupled between the second control terminal 40 and the fixed voltage node 30. The second gate resistor $R_{G2}$ provides an optional means for stabilizing the DA 10. Moreover, in at least some embodiments the DC blocking capacitor $C_{G2}$ is realized as a programmable array of capacitors.

An input transistor $M_3$ is included in a common drain configuration and has a third current output terminal 42 coupled to the first control terminal 34 of the main transistor $M_1$, a third control terminal 44 coupled to a corresponding one of the second plurality of connection nodes 26, and a third current input terminal 46 coupled to a drain bias input $V_{DO}$ and is configured to bias the input transistor $M_3$. Each of plurality of amplifier cells $A_1$ through $A_N$ further includes current source circuitry 48 to provide further bias control for the input transistor $M_3$ and the main transistor $M_1$. In the exemplary embodiment of FIG. 1, the current source circuitry is a resistor $R_{S1}$ coupled to an electronically variable voltage source $V_{S1}$ through a source bias input $V_{SO}$.

An output termination network 50 is made up of an output resistor $R_{O1}$ and an output capacitor $C_{O1}$ that are coupled in series between the output termination input 14 and the fixed voltage node 30. A supply voltage input terminal $V_{DD}$ is included to supply power to the DA 10 and is coupled between the output resistor $R_{O1}$ and the output capacitor $C_{O1}$. An input termination network 52 is made up of an input resistor $R_{I1}$ and an input capacitor $C_{I1}$ that are coupled in series between the input termination input 24 and the fixed voltage node 30. A gate voltage input terminal $V_{GG}$ is included to supply gate bias to the DA 10 and is coupled between the input resistor $R_{I1}$ and the input capacitor $C_{I1}$.

In at least embodiment, the DA 10 is a gallium nitride (GaN) low-noise distributed power amplifier. Moreover, in at least one embodiment the main transistor $M_1$ is an enhancement-mode device, the cascode transistor $M_2$ is a depletion-mode device, and the input transistor $M_3$ is an enhancement-mode device. Furthermore, in at least one embodiment, the cascode transistor is a GaN transistor, whereas the main transistor $M_1$ and the input transistor $M_3$ are based on other transistor technologies. For example, the main transistor $M_1$ and the input transistor $M_3$ can be silicon transistors. Further still, in at least one embodiment, additional cascode transistors are coupled in series between the main transistor $M_1$ and the cascode transistor $M_2$ to provide increased voltage operation.

Figure 2:
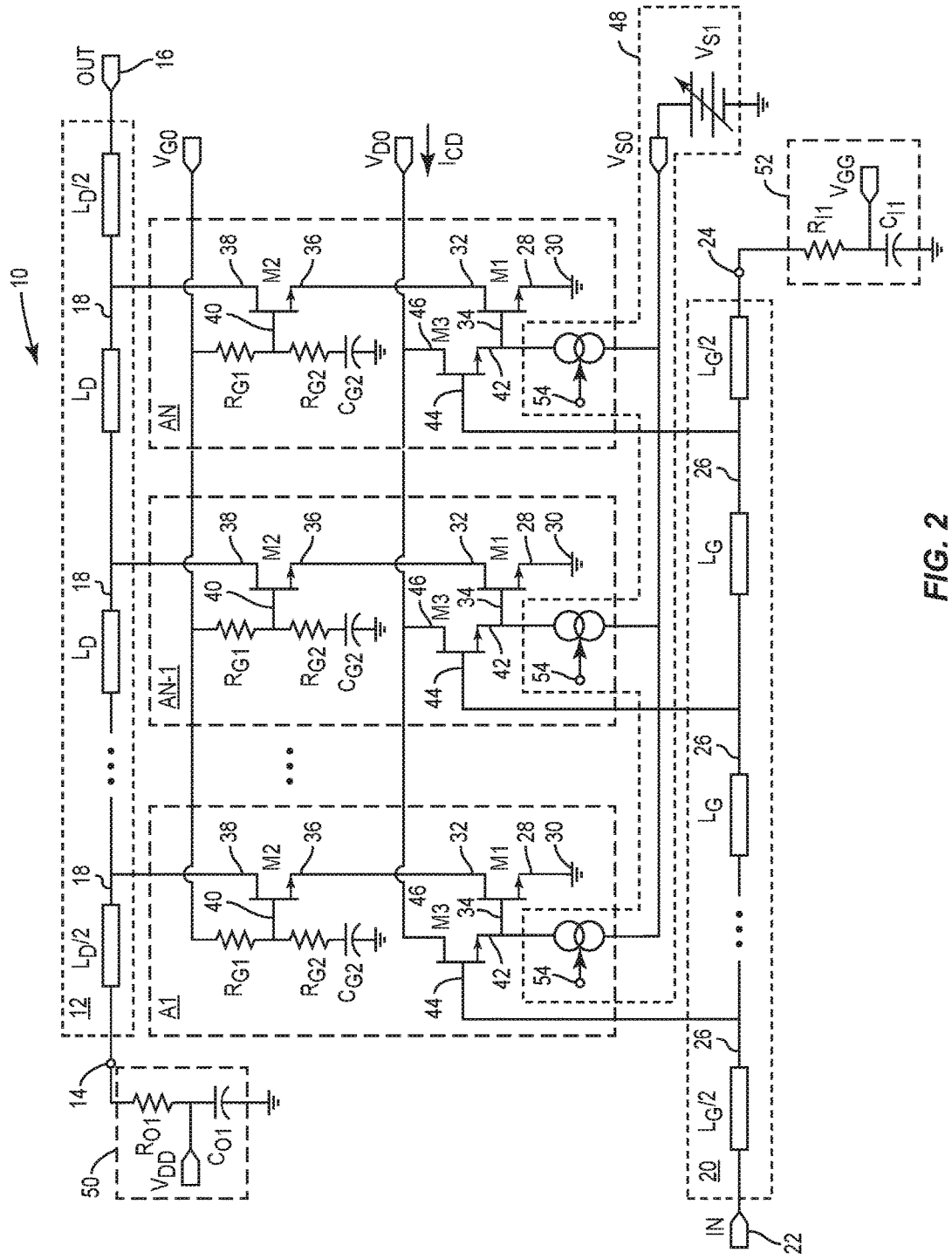
FIG. 2 is a circuit schematic of another embodiment of the DA in which current source circuitry is active with a current source control terminal.
Figure 3:
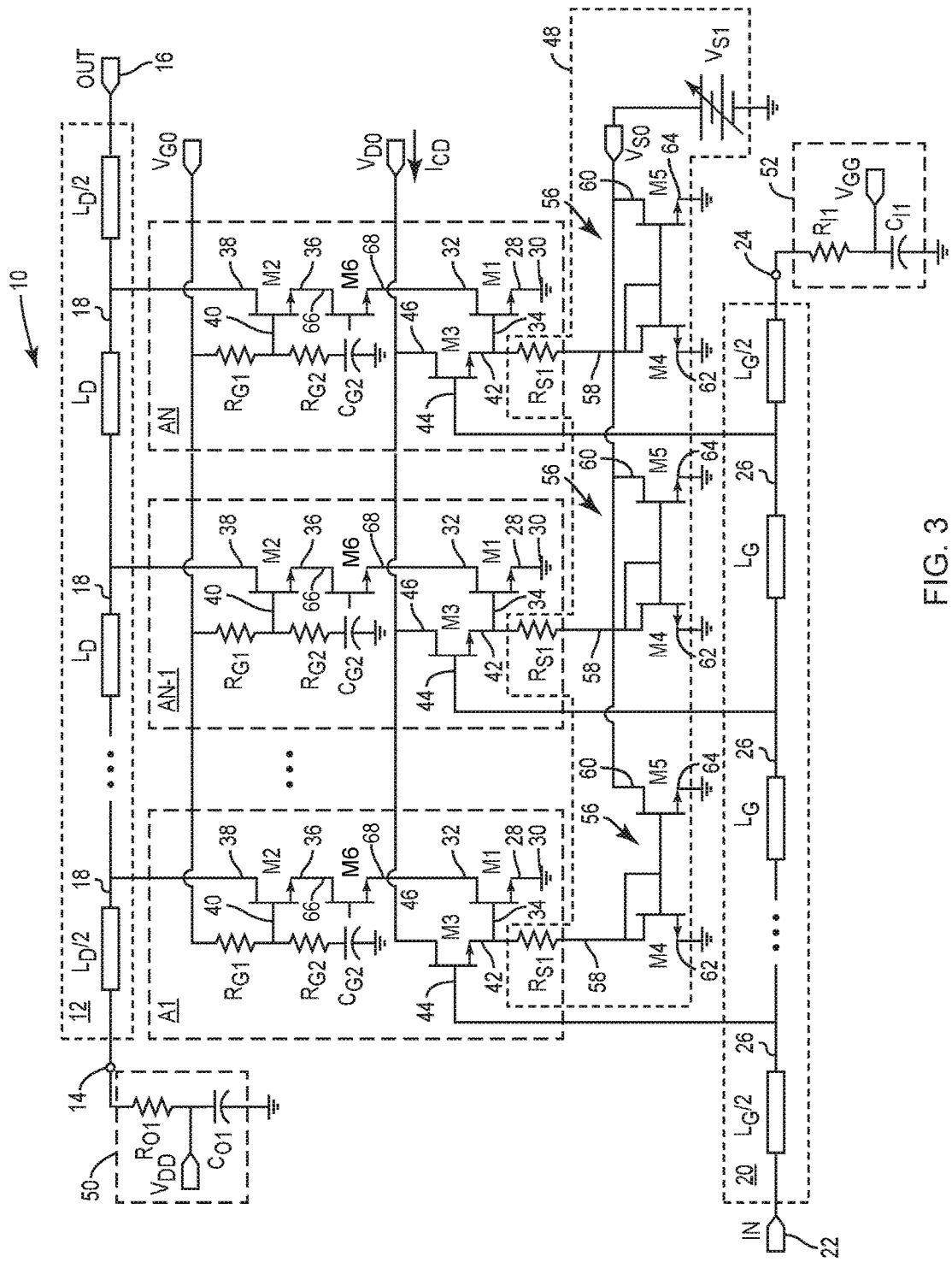
FIG. 3 is a circuit schematic of yet another embodiment of the DA in which the current control circuitry includes a current mirror circuit.

FIG. 2 is a circuit schematic of another embodiment of the DA 10 in which the current source circuitry 48 is active with a current source control terminal 54. FIG. 3 is a circuit schematic of yet another embodiment of the DA 10 in which the current control circuitry 48 includes a current mirror circuit 56 made up of a first mirror transistor $M_4$ and a second mirror transistor $M_5$. A fourth current input terminal 58 of the first mirror transistor $M_4$ is coupled to the first control terminal 34 of the main transistor $M_1$. A fifth current input terminal 60 of the second mirror transistor $M_5$ is coupled to the source bias input $V_{SO}$. A fourth current output terminal 62 of the first mirror transistor M4 is coupled to the fixed voltage node 30. A fifth current output terminal 64 of the second mirror transistor M5 is also coupled to the fixed voltage node 30. The embodiment of FIG. 3 includes an additional transistor M6 having a current input terminal 66 coupled to the second current output terminal 36 and a current output terminal 68 coupled to the first current input terminal 32 of the main transistor M1 to increase the breakdown voltage of the DA 10.

Referring to all three embodiments depicted in FIGS. 1-3, notice that the common-drain configured input transistor $M_3$ is directly coupled to the main transistor $M_1$ in order to preserve the DC gain response of the DA 10. The device periphery of the main transistor $M_1$ can be scaled for greater third-order intercept point (IP3) and Pout, while the common-drain configured input transistor $M_3$ may be sized to minimize the impact to bandwidth response. Additionally, the input transistor $M_3$ can reduce the input capacitance and the cascode transistor $M_2$ can reduce the output capacitance and aid in inhibiting amplitude modulation to phase modulation (AM-PM) distortion. In at least one exemplary embodiment, the current source circuitry 48 is configured to increase the DA's IP3 response up to 11 dB over a 1 dB gain-bandwidth by adjusting current flow through the current source circuitry 48 by way of the current source control terminal 54 (FIG. 2). In at least one other exemplary embodiment, the current source circuitry 48 is configured to increase the IP3 response of DA 10 by up to 11 dB over a 3 dB gain-bandwidth by adjusting current flow through the current source circuitry 48 by way of the current source control terminal 54.

In other embodiments, the current source circuitry 48 is configured to increase the IP3 response of DA 10 between a range of 0 dB to 11 dB between a mid-band frequency and a 1 dB upper band frequency by adjusting current flow through the current source circuitry 48 by way of the current source control terminal 54 (FIG. 2). In yet other embodiments, the current source circuitry is configured to increase the IP3 response of DA 10 between a range of 0 dB to 11 dB between mid-band frequency and a 3 dB upper band frequency by adjusting current flow through the current source circuitry by way of the current source control terminal. In yet other embodiments, the current source circuitry 48 is configured to increase the IP3 response of DA 10 by up to 11 dB without decreasing IP3 divided by direct current power dissipation (Pdc) by adjusting current flow through the current source circuitry by way of the current source control terminal. The current source circuitry 48 is also configured to increase the IP3/Pdc of DA 10 without decreasing gain-frequency bandwidth. Further still, the current source circuitry 48 is configured to increase IP3-frquency bandwidth response of the DA 10 without decreasing gain-frequency bandwidth by adjusting current flow through the current source circuitry 48 by way of the current source control terminal 54.

In some embodiments, the current source circuitry 48 is also configured to increase IP3 up to 11 dB at a low-gain band frequency such as 3 GHz by adjusting current flow through the current source circuitry 48 by way of the current source control terminal 54 (FIG. 2). In other embodiments, the current source circuitry 48 is also configured to increase IP3 up to 11 dB at a mid-gain band frequency such as 20 GHz by adjusting current flow through the current source circuitry 48 by way of the current source control terminal 54. In yet other embodiments, the current source circuitry 48 is also configured to increase IP3 up to 11 dB at a high-gain band frequency such as 45 GHz by adjusting current flow through the current source circuitry 48 by way of the current source control terminal 54. In further embodiments, the current source circuitry 48 is configured to increase the DA's IP3 equal to or greater than 3 dB without doubling total power dissipation by adjusting current flow through the current source circuitry 48 by way of the current source control terminal 54.

Figure 4:
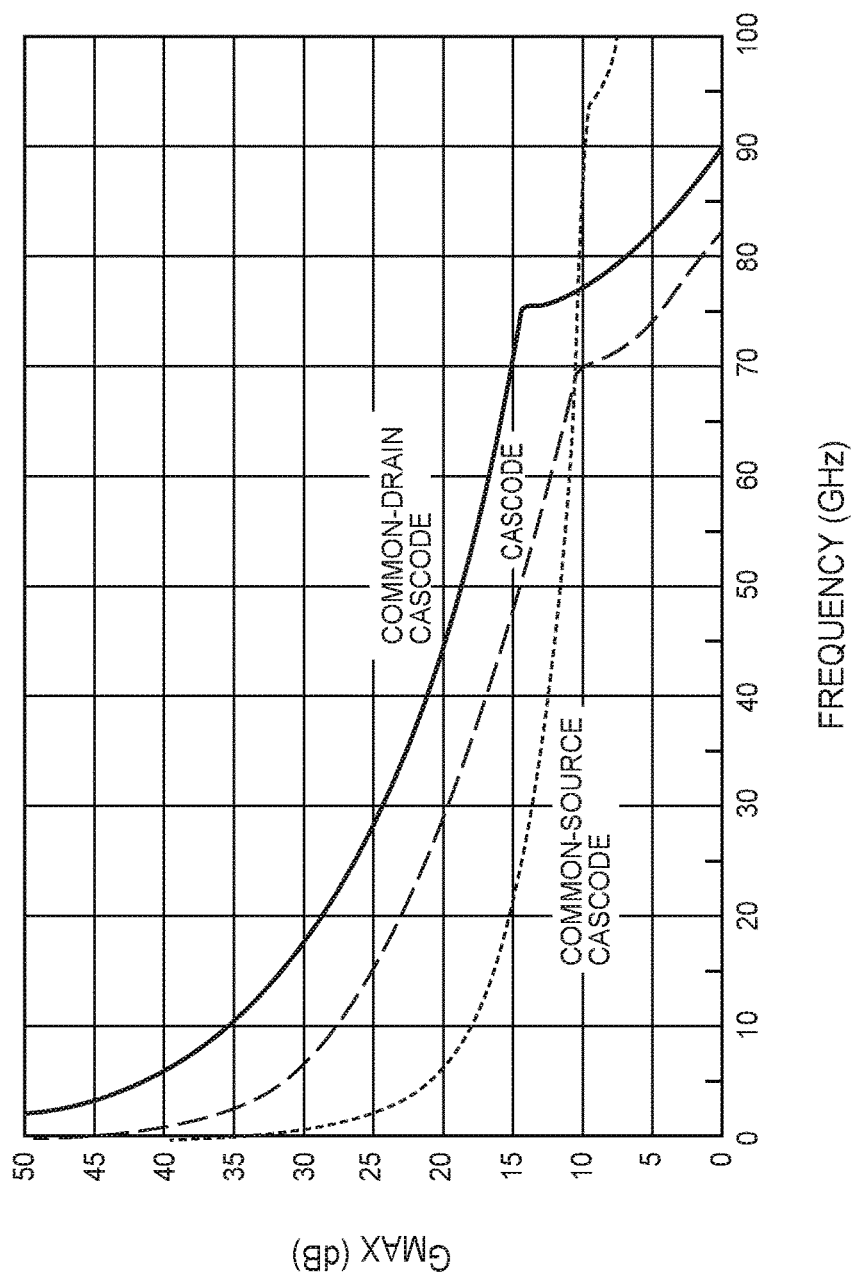
FIG. 4 is a graph of maximum gain versus frequency that compares performance of the common-drain cascode amplifier cell of the present DA with a conventional cascode amplifier cell and a conventional common-source amplifier cell.

FIG. 4 is a graph of maximum gain versus frequency that compares performance of the common-drain cascode type amplifier cells $A_1$ through $A_N$ of the present DA 10 with a conventional cascode amplifier cell and a conventional common-source amplifier cell configuration. Notice that the common-drain cascode-type amplifier cells $A_1$ through $A_N$ of the present DA 10 provides increased maximum available gain ($G_{MAX}$) and increased bandwidth over the conventional cascode amplifier and the conventional common-source amplifier. A conventional cascode amplifier does not include the common-drain configured input transistor $M_3$ depicted in FIGS. 1-3. Instead of including the common-drain configured input transistor $M_3$, the conventional cascode amplifier couples the first control terminal 34 of the main transistor $M_1$ to a corresponding one of the second plurality of connection nodes 26.

Figure 5:
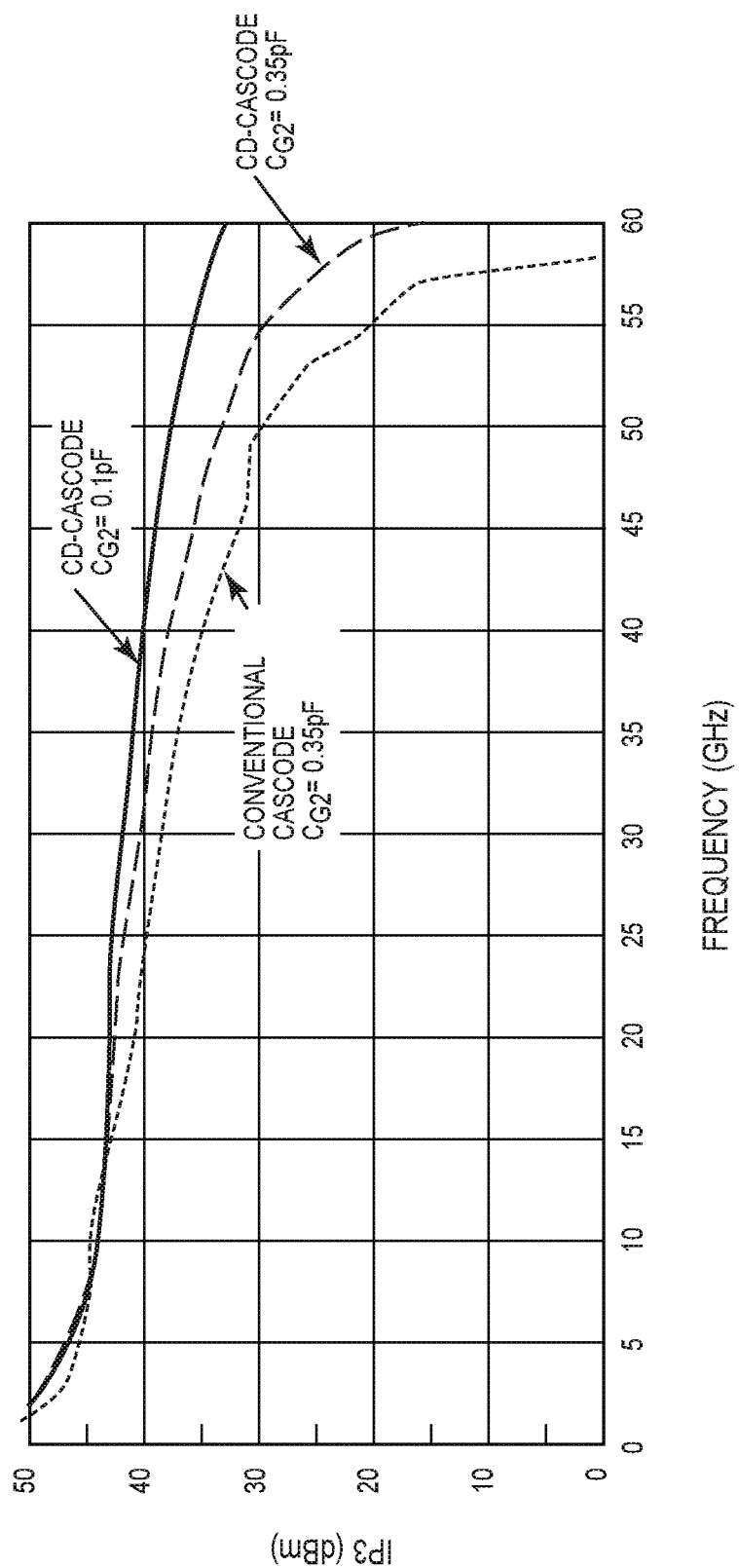
FIG. 5 is a graph of third-order intercept point (IP3) versus frequency comparing the common-drain cascode amplifier of the present DA with the conventional cascode amplifier.

FIG. 5 is a graph of IP3 versus frequency comparing the present DA with the conventional cascode amplifier. In particular, FIG. 5 shows the simulated IP3 response comparing the conventional cascode DA to the DA 10 with $C_{G2}$=0.35 pF illustrating a dramatic improvement for the DA 10. This value of $C_{G2}$ is tuned with respect to linearity, stability, and gain-bandwidth response. Because the DA 10 offers additional maximum gain $G_{MAX}$ (FIG. 4), a smaller $C_{G2}$=0.1 pF closer to a maximized linear cascode device performance value can be employed without compromising the gain-bandwidth provided by the conventional cascode DA.

Figure 6:
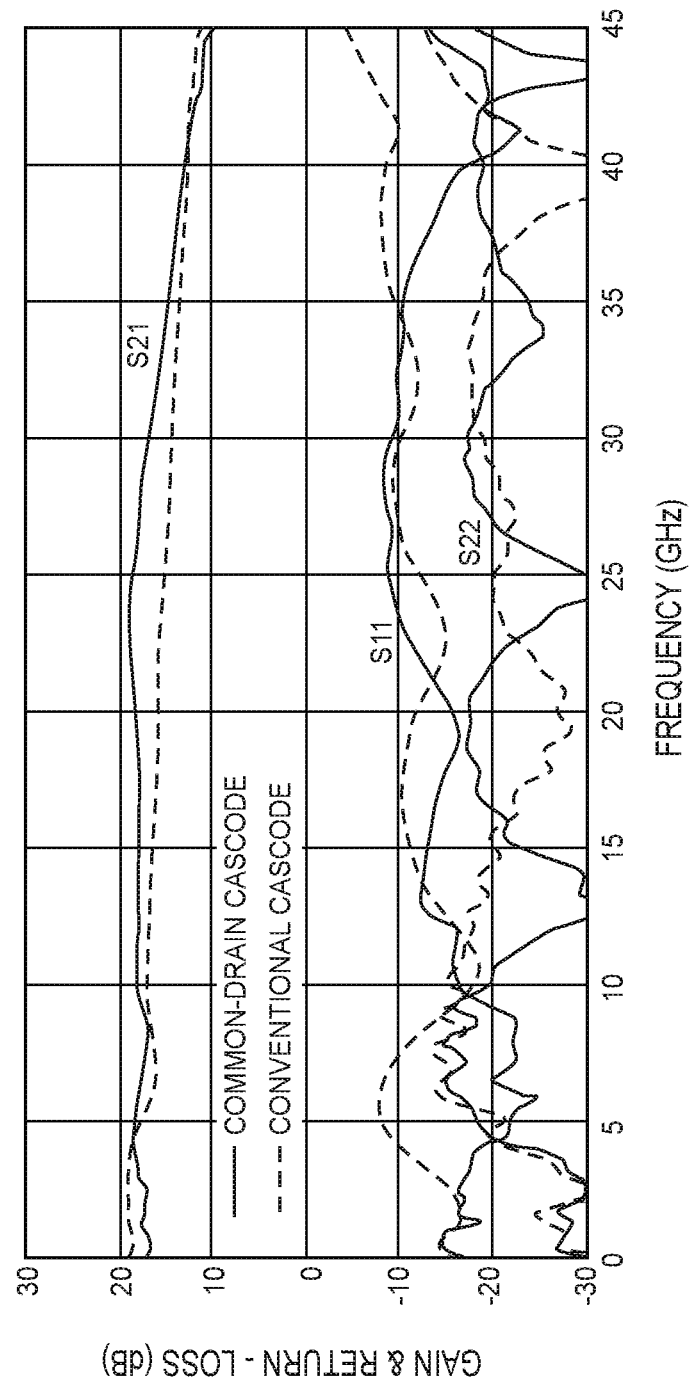
FIG. 6 is a graph depicting the S-parameters from 40 MHz-45 GHz for both the conventional cascode DA and the present DA.

FIG. 6 is a graph depicting the S-parameters from 40 MHz-45 GHz for both the conventional cascode DA and the DA 10, wherein both are fabricated as monolithic microwave integrated circuits. The conventional cascode DA has a low frequency gain of 18.5 dB while maintaining greater than 10 dB up to 45 GHz with good input and output return-loss. In contrast, the DA 10 has a slightly lower nominal gain of 17 dB but maintains a higher and flatter gain than the conventional cascode across the 5-40 GHz frequency band while also maintain greater than 10 dB gain up to 45 GHz with relatively good input and output return-loss. Moreover, the DA 10 provides a relatively slight improvement in overall input return-loss due to the common-drain configuration of the input transistor $M_3$.

Figure 7:
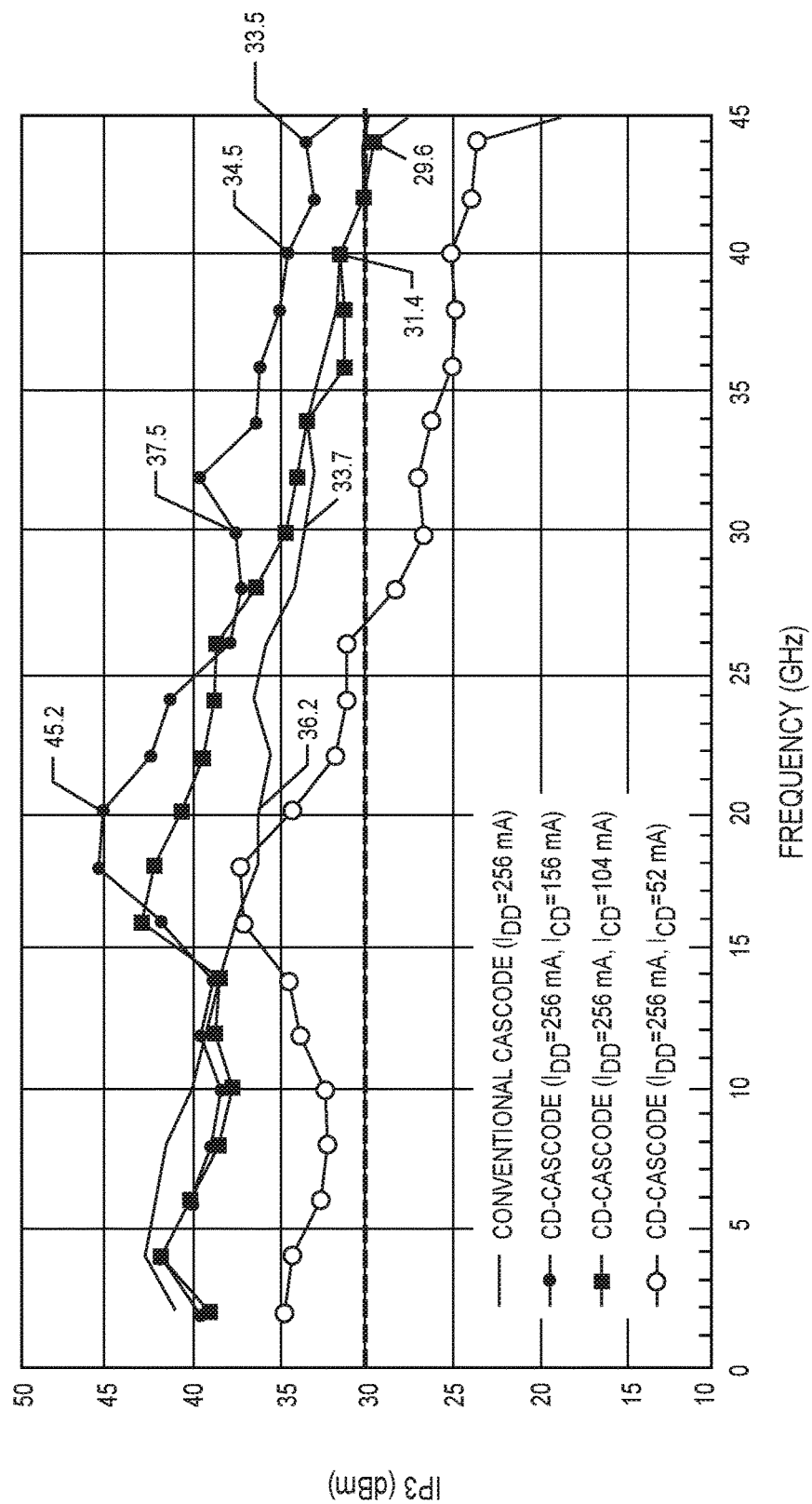
FIG. 7 is a graph depicting measured IP3 performance from 2-44 GHz for the present DA and the convention cascode DA.

FIG. 7 is a graph depicting measured IP3 performance from 2-44 GHz for the DA 10 and the convention cascode DA. A difference frequency of 1.3 MHz and Pout/Tone level of 8 dBm are used in the measurements. An IP3 intercept figure-of-merit validity was confirmed by measuring IP3 over adjacent powers of 5 and 10 dBm. The DA 10 performance was also measured for different common-drain current $I_{CD}$ magnitudes for common-drain transistor biases of 52 mA, 104 mA, and 156 mA, which correspond to current densities of 43, 87, and 130 mA/mm, respectively. At the highest $I_{CD}$ current of 156 mA (130 mA/mm) for the common-drain configured input transistors $M_3$, the DA 10 demonstrates a relatively dramatic improvement in upper bandwidth IP3 performance (round dotted line) compared with the conventional cascode DA in the frequency range of 20-44 GHz (solid black line). At 20 GHz, the DA 10 obtains an IP3 of 45.2 dBm versus 36.2 dBm for the conventional cascode DA, which is a relatively remarkable 9 dB improvement in IP3. At frequencies of 30, 40, and 44 GHz, the DA 10 achieves an IP3 of 37.5, 34.5, and 33.5 dBm compared with the conventional cascode DA, which achieves 33.7 dBm, 31.4 dBm, and 29.6 dBm, respectively. Thus, for these millimeter-wave frequencies, the DA 10 achieves an IP3 improvement between 3.1 dB and 3.9 dB over the conventional cascode DA at millimeter-wave frequencies, significantly improving the IP3-bandwidth, while consuming substantially less than twice the DC power normally required to achieve a 3 dB improvement in IP3. As mentioned above, these results are believed to be the highest IP3 results reported for a GaN distributed amplifier in the millimeter-wave frequency regime while preserving baseband frequency response.

Figure 8:
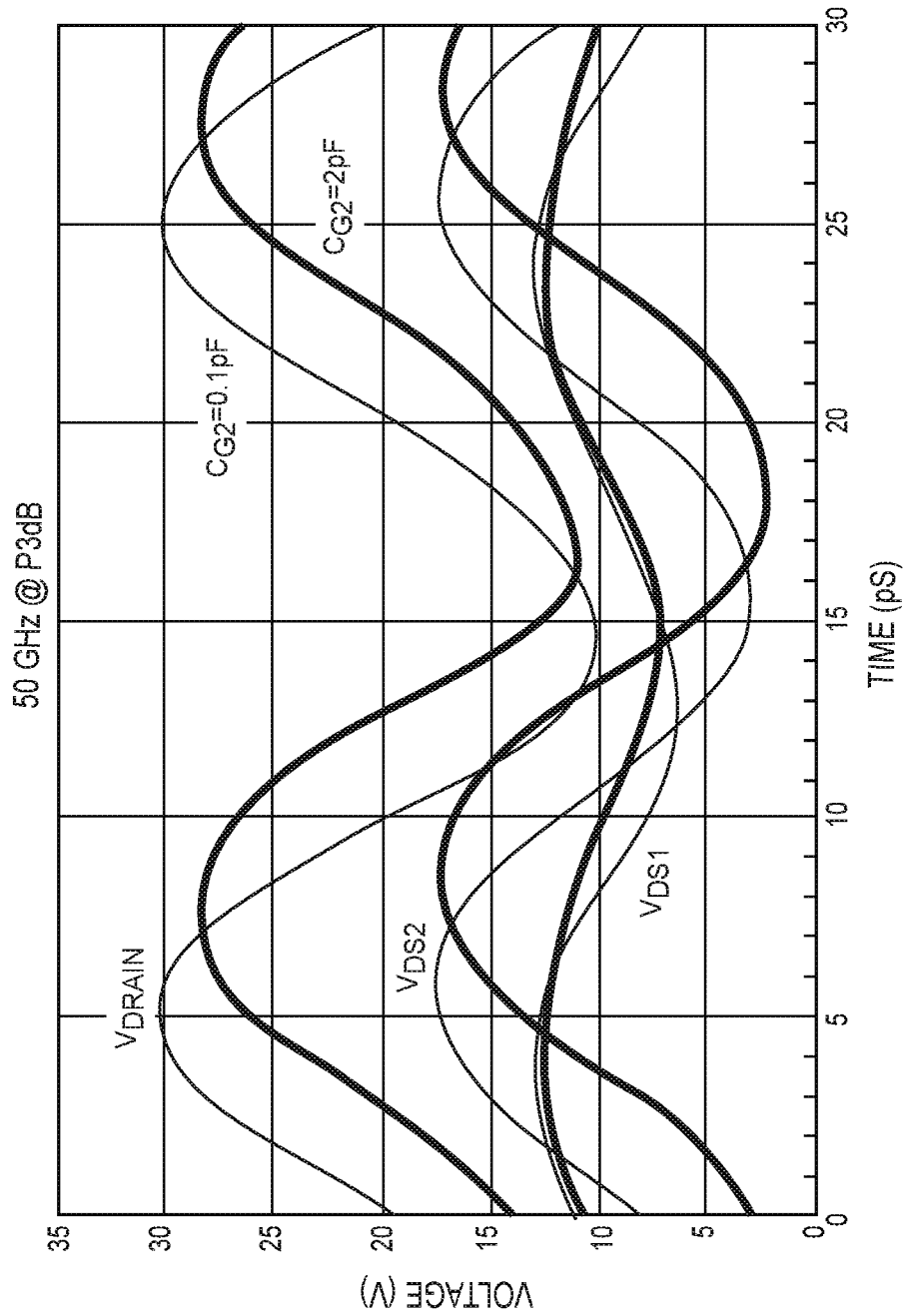
FIG. 8 is a time domain graph of amplitude voltage versus time illustrating the effect of $C_{G2}$ on a radio frequency signal amplified by the present DA.

FIG. 8 is a time domain graph of amplitude voltage versus time illustrating the effect of $C_{G2}$ on a radio frequency signal amplified by the DA 10. In particular, FIG. 8 demonstrates that decreasing the capacitance value of $C_{G2}$ places a higher load on the main transistor $M_1$ and increases linearity with a decrease in bandwidth performance.

Figure 9:
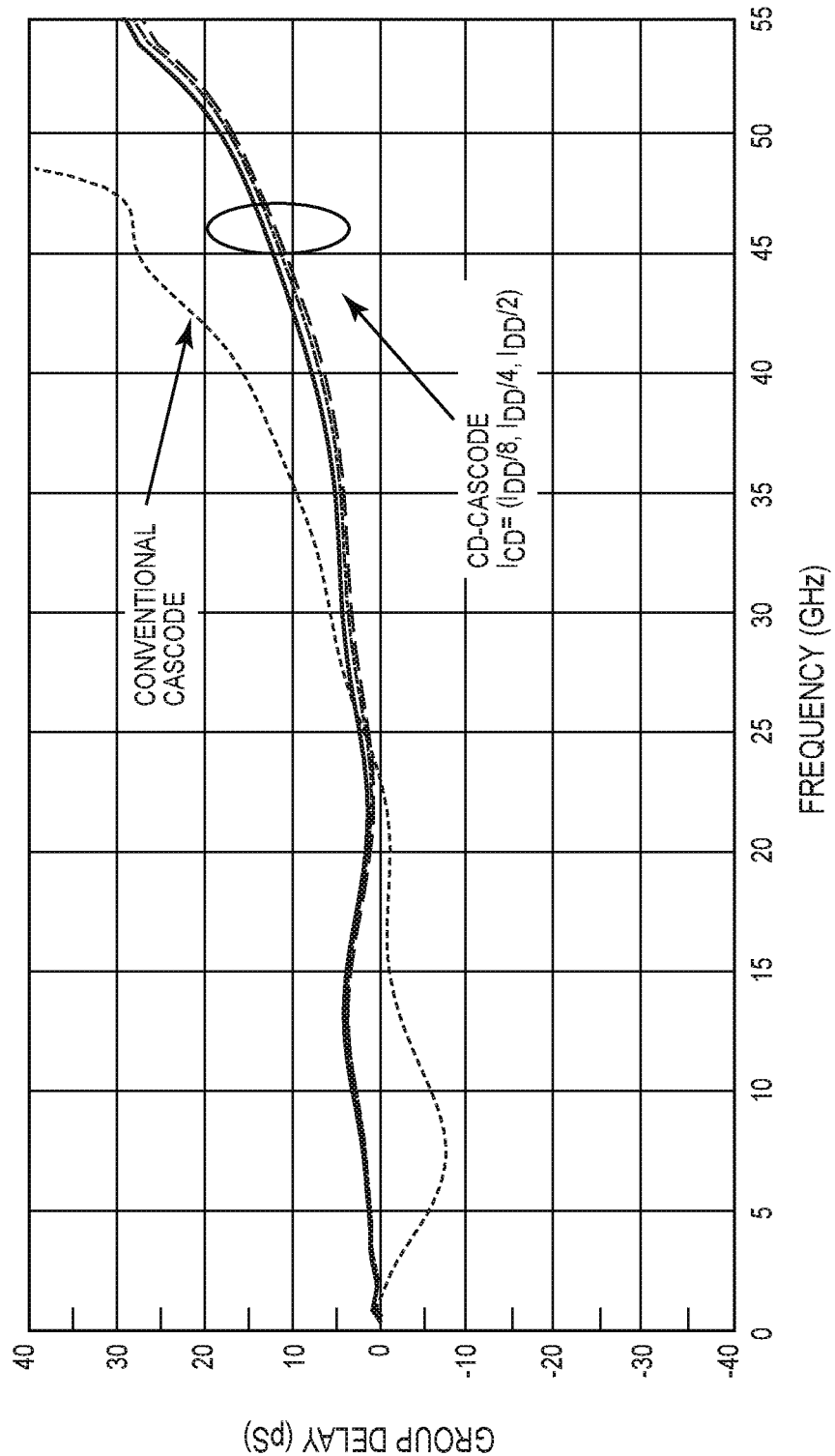
FIG. 9 is a graph of group delay versus frequency comparing the present DA with a conventional cascode DA.

FIG. 9 is a graph of group delay versus frequency comparing the group delay performance of the DA 10 with the group delay performance of a conventional cascode DA. In particular, group delay is relatively insensitive to bias variation with respect to changes in the magnitude of a common drain current $I_{CD}$. As such, the DA 10 provides increased flexibility with regard to adjusting group delay for maximum bandwidth and maximum linearity.

Figure 10:
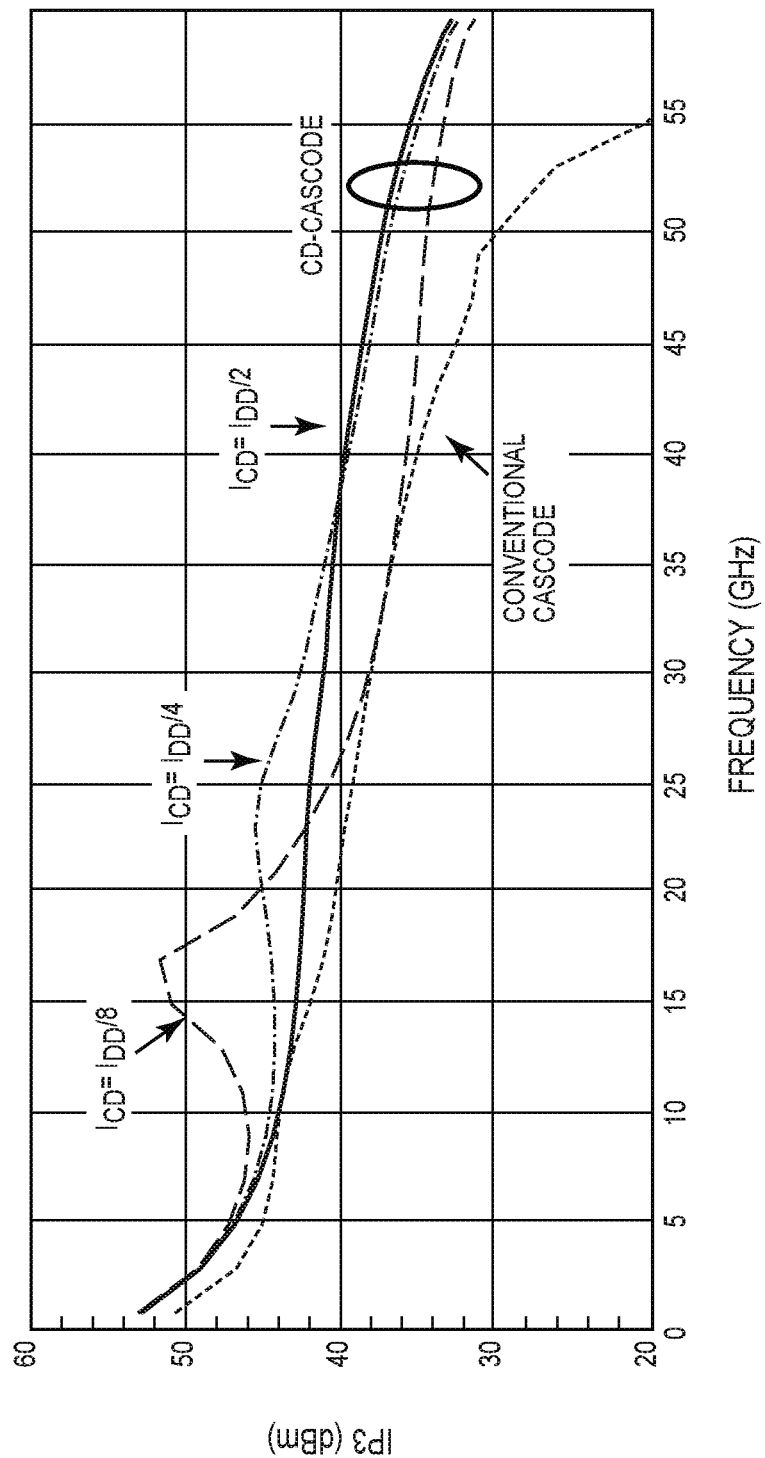
FIG. 10 is a graph of IP3 versus frequency for various magnitudes of common drain current for the present DA in comparison with a conventional cascode DA.

FIG. 10 is a graph of IP3 versus frequency for various magnitudes of common drain current $I_{CD}$ for the DA 10 in comparison with a conventional cascode DA. Notice that even at the lowest magnitude of common drain current $I_{CD}=I_{DD}/8$, the IP3 performance is greater than or equal to the IP3 performance of the conventional cascode DA. The IP3 performance at greater magnitudes of the common drain current $I_{CD}$ up to $I_{CD}=I_{DD}$ is superior to the IP3 performance of the conventional cascode DA.

Power amplifiers have some non-linear gain with varying output power. Non-linear gain results in amplitude modulation to amplitude modulation (AM-AM) conversion, which is also referred to as AM-AM distortion. Referring back to FIGS. 1-3, the current source circuitry 48 is configured to linearize an AM-AM response and increase maximum linear output power from the DA 10 for a given AM-AM distortion by adjusting current flow through the current source circuitry 48 by way of the current source control terminal 54 (FIG. 2). Examples of a given AM-AM distortion include AM-AM distortion levels that range from 0.1 dB to 1 dB.

Figure 11:
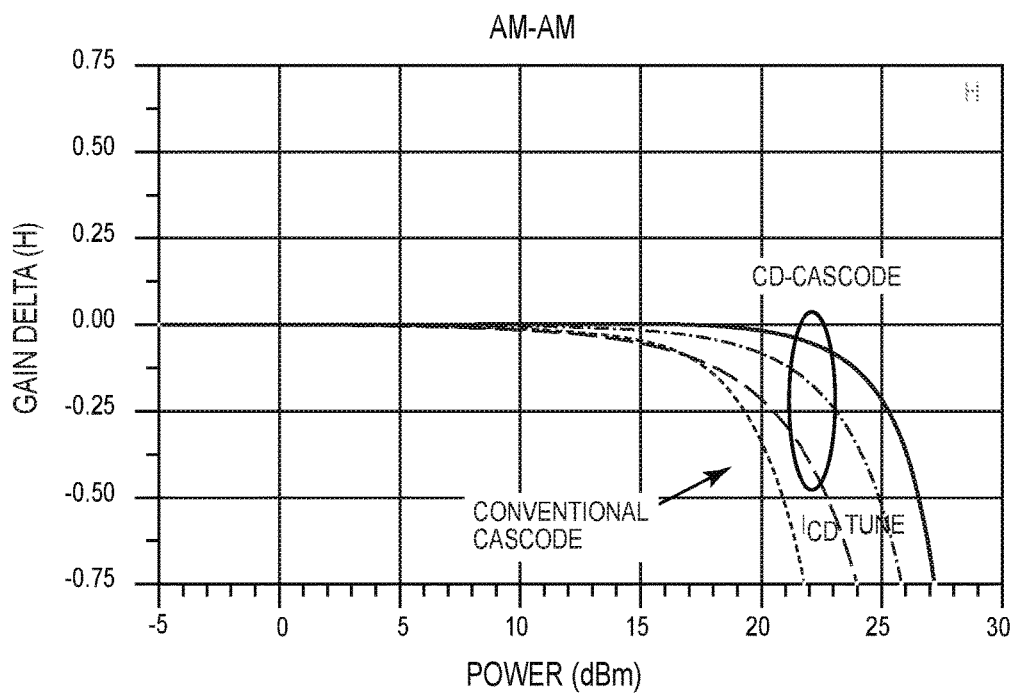
FIG. 11 is a graph comparing a conventional cascode DA to the present DA with regard to amplitude modulation-amplitude modulation (AM-AM) distortion.

FIG. 11 is a graph comparing a conventional cascode DA to the DA 10 with regard to AM-AM distortion. In particular, FIG. 11 compares changes in gain (GAIN DELTA) versus output power. The curves passing through the ellipse represent gain delta curves for the DA 10 operated at three different levels of common drain current Iop. Notice that the DA 10 extends the upper range of output power with regard to AM-AM distortion.

Nonlinearities associated with a power amplifier also generate unwanted phase components in the output of the power amplifier. The process by which the unwanted phase components are generated is referred to as AM-PM distortion. AM-PM distortion degrades the output radio frequency spectrum and the error vector magnitude of a communication system that employs the power amplifier. The current source circuitry 48 is further configured to linearize an AM-AM response and increase maximum linear output power from the DA 10 for a given AM-AM distortion by adjusting current flow through the current source circuitry 48 by way of the current source control terminal 54. Examples of a given AM-PM distortion include AM-PM distortion levels that range from 0.5 degree to 5 degrees in-phase.

Figure 12:
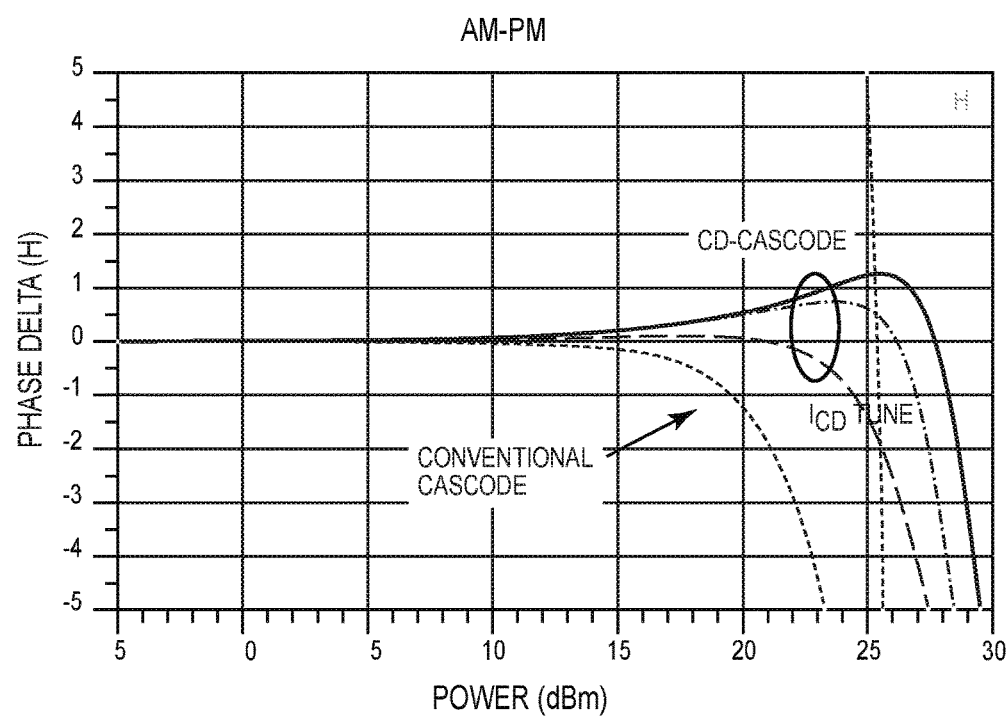
FIG. 12 is a graph comparing a conventional cascode DA to the present DA with regard to amplitude modulation-phase modulation (AM-PM) distortion.

FIG. 12 is a graph comparing a conventional cascode DA to the DA 10 with regard to AM-PM distortion. The curves passing through the ellipse represent phase delta curves for the DA 10 operated at three different levels of common drain current $I_{CD}$. Notice that the DA 10 extends the upper range of output power with regard to AM-PM distortion. The common drain configuration for the input transistor M3 reduces input and output parasitic capacitances, which aids in inhibiting AM-PM distortion.

Those skilled in the art will recognize improvements and modifications to the preferred embodiments of the present disclosure. All such improvements and modifications are considered within the scope of the concepts disclosed herein and the claims that follow.

What is claimed is:

1. A distributed amplifier (DA) comprising:
   a first plurality of inductive elements coupled in series between an output termination input and a DA output to form a first plurality of connection nodes, such that each of the first plurality of connection nodes is coupled to a corresponding adjacent pair of the first plurality of inductive elements;
   a second plurality of inductive elements coupled in series between a DA input and an input termination input to form a second plurality of connection nodes, such that each of the second plurality of connection nodes is coupled to a corresponding adjacent pair of the second plurality of inductive elements; and
   a plurality of amplifier cells, such that each of the plurality of amplifier cells comprises:
   a main transistor having a first current output terminal coupled to a fixed voltage node, a first current input terminal, and a first control terminal;
   a cascode transistor having a second current output terminal coupled to the first current input terminal, a second current input terminal coupled to a corresponding one of the first plurality of connection nodes, and a second control terminal configured to bias the cascode transistor;
   an input transistor having a third current output terminal coupled to the first control terminal of the main transistor, a third control terminal coupled to a corresponding one of the second plurality of connection nodes, and a third current input terminal configured to bias the input transistor; and current source circuitry coupled between the third current output terminal and a DA bias terminal.

2. The DA of claim 1 wherein the current source circuitry is a resistor and an adjustable voltage source coupled in series.

3. The DA of claim 1 wherein the current source circuitry includes at least one active current source with a current source control terminal.

4. The DA of claim 1 wherein the current source circuitry includes at least one current mirror.

5. The DA of claim 1 wherein the current source circuitry is configured to linearize an amplitude modulation-amplitude modulation (AM-AM) response and increase maximum linear output power from the DA for a given AM-AM distortion by adjusting current flow through the current source circuitry by way of a current source control terminal.

6. The DA of claim 1 wherein the current source circuitry is configured to linearize an amplitude modulation-phase modulation (AM-PM) response and increase maximum linear output power from the DA for a given AM-PM distortion by adjusting current flow through the current source circuitry by way of a current source control terminal.

7. The DA of claim 1 wherein the current source circuitry is configured to increase the DA's IP3 response up to 11 dB over a 1 dB gain-bandwidth by adjusting current flow through the current source circuitry by way of a current source control terminal.

8. The DA of claim 1 wherein the current source circuitry is configured to increase the DA's IP3 response up to 11 dB over a 3 dB gain-bandwidth by adjusting current flow through the current source circuitry by way of a current source control terminal.

9. The DA of claim 1 wherein the current source circuitry is configured to increase the DA's IP3 response between a range of 0 dB to 11 dB between a mid-band frequency and a 3 dB upper band frequency by adjusting current flow through the current source circuitry by way of a current source control terminal.

10. The DA of claim 1 wherein the current source circuitry is configured to increase the DA's IP3 response between a range of 0 dB to 11 dB between a mid-band frequency and a 1 dB upper band frequency by adjusting current flow through the current source circuitry by way of a current source control terminal.

11. The DA of claim 1 wherein the current source circuitry is configured to increase the DA's IP3 response up to 11 dB without decreasing IP3/(direct current power dissipation) by adjusting current flow through a current source circuitry by way of the current source control terminal.

12. The DA of claim 1 wherein the current source circuitry is configured to increase IP3-frequency bandwidth response of the DA without decreasing gain-frequency bandwidth by adjusting current flow through a current source circuitry by way of the current source control terminal.

13. The DA of claim 1 wherein the current source circuitry is configured to increase IP3 up to 11 dB at low-gain band frequency by adjusting current flow through the current source circuitry by way of a current source control terminal.

14. The DA of claim 1 wherein the current source circuitry is configured to increase IP3 up to 11 dB at mid-gain band frequency by adjusting current flow through the current source circuitry by way of a current source control terminal.

15. The DA of claim 1 wherein the current source circuitry is configured to increase IP3 up to 11 dB at high-gain band frequency by adjusting current flow through the current source circuitry by way of a current source control terminal.

16. The DA of claim 1 wherein the current source circuitry is configured to increase the DA's IP3 equal to or greater than 3 dB without doubling total power dissipation by adjusting current flow through the current source circuitry by way of a current source control terminal.

17. The DA of claim 1 wherein the current source circuitry is configured to increase the DA's IP3/(direct current power dissipation) without decreasing gain-frequency bandwidth.

18. The DA of claim 1 further including an input impedance termination circuit coupled between the input termination input and the fixed voltage node.

19. The DA of claim 1 further including an output impedance termination circuit coupled between the output termination input and the fixed voltage node.

20. The DA of claim 1 wherein the DA is a gallium nitride (GaN) low-noise distributed power amplifier.

21. The DA of claim 1 wherein the main transistor is an enhancement-mode device, the input transistor is an enhancement-mode device, and the cascode transistor is a depletion-mode device.

22. The DA of claim 1 wherein the cascode transistor is a GaN transistor and the input transistor and the main transistor are not GaN transistors.

23. The DA of claim 22 wherein the input transistor and the main transistor are silicon transistors.

24. The DA of claim 1 further includes at least one additional transistor having a current input terminal coupled to the second current output terminal and a current output terminal coupled to the first current input terminal of the main transistor to increase breakdown voltage of the DA.

25. The DA of claim 1 wherein group delay for a signal propagating between the DA input and the DA output is less than 10 picoseconds over a bandwidth from 0 GHz to 40 GHz.

26. The DA of claim 1 wherein group delay for a signal propagating between the DA input and DA output is less than 30 picoseconds over a bandwidth from 40 GHz to 55 GHz.

27. The DA of claim 1 wherein third-order intercept point (IP3) is greater than 32 dBm for signals having a frequency in a range of 55 GHz to 60 GHz.

28. The DA of claim 1 wherein IP3 is greater than 36 dBm for signals having a frequency in a range of 40 GHz to 55 GHz.

29. The DA of claim 1 wherein IP3 is greater than 40 dBm for signals having a frequency in a range of 25 GHz to 40 GHz.

30. The DA of claim 1 wherein IP3 is greater than 42 dBm for signals having a frequency in a range of 15 GHz to 25 GHz.

31. The DA of claim 1 further includes a direct current (DC) blocking capacitor coupled between the second control terminal of the cascode transistor and the fixed voltage node.

32. The DA of claim 31 wherein the capacitance of the DC blocking capacitor is electronically tunable.

* * * * *

UNITED STATES PATENT AND TRADEMARK OFFICE
CERTIFICATE OF CORRECTION

PATENT NO. : 10,340,858 B2
APPLICATION NO. : 15/636800
DATED : July 2, 2019
INVENTOR(S) : Kevin Wesley Kobayashi Page 1 of 1

It is certified that error appears in the above-identified patent and that said Letters Patent is hereby corrected as shown below:

In the Specification

In Column 4, Line 43, replace "$V_{DO}$" with --$V_{D0}$--.

In Column 8, Line 8, replace "common drain current Iop" with --common drain current $I_{CD}$--.

Signed and Sealed this
Twentieth Day of August, 2019

Andrei Iancu
*Director of the United States Patent and Trademark Office*